(12) United States Patent
Kawada

(10) Patent No.: US 7,510,977 B2
(45) Date of Patent: Mar. 31, 2009

(54) METHOD FOR MANUFACTURING SILICON CARBIDE SEMICONDUCTOR DEVICE

(75) Inventor: Yasuyuki Kawada, Matsumoto (JP)

(73) Assignee: Fuji Electric Holdings Co., Ltd. (JP)

( * ) Notice: Subject to any disclaimer, the term of this patent is extended or adjusted under 35 U.S.C. 154(b) by 105 days.

(21) Appl. No.: 11/757,579

(22) Filed: Jun. 4, 2007

(65) Prior Publication Data
US 2007/0281462 A1 Dec. 6, 2007

(30) Foreign Application Priority Data
Jun. 5, 2006 (JP) ............... 2006-155624

(51) Int. Cl.
*H01L 21/302* (2006.01)
*H01L 21/461* (2006.01)
(52) U.S. Cl. ............ 438/714; 438/715; 438/484; 257/E21.056; 257/E21.06
(58) Field of Classification Search .......... 438/714, 438/237, 484, 715, 317; 257/E21.056, E21.06, 257/E21.062
See application file for complete search history.

(56) References Cited

U.S. PATENT DOCUMENTS

| | | | |
|---|---|---|---|
| 5,234,537 A | | 8/1993 | Nagano et al. |
| 5,902,117 A | * | 5/1999 | Rottner et al. ............ 438/105 |
| 2004/0159865 A1 | * | 8/2004 | Allen et al. ............... 257/280 |
| 2005/0001276 A1 | * | 1/2005 | Gao et al. .................. 257/417 |

FOREIGN PATENT DOCUMENTS

| | | |
|---|---|---|
| JP | 08-12286 B2 | 2/1996 |
| JP | 2661390 B2 | 6/1997 |
| JP | 2992596 B2 | 10/1999 |
| JP | 3593195 B2 | 9/2004 |
| JP | 2005-56868 A | 3/2005 |
| JP | 3761546 B2 | 1/2006 |

\* cited by examiner

*Primary Examiner*—Caridad M Everhart
(74) *Attorney, Agent, or Firm*—Rossi, Kimms & McDowell LLP

(57) ABSTRACT

A method for manufacturing a silicon carbide (SiC) semiconductor device is disclosed that uses dry etching with the use of high-density inductive coupled plasma (ICP). The method employs a first dry etching and a sequential second dry etching under conditions that differ from those used in the first dry etching. The dry etch process allows a trench to be deeply etched to a depth of more than 3 μm in a SiC laminated semiconductor substrate and allows the bottom of the trench to be flat without forming a convexo-concave shape having an acute angle which has an influence on characteristics of a breakdown voltage due to electric field concentration being caused in the bottom.

10 Claims, 13 Drawing Sheets

METHOD FOR MANUFACTURING SILICON CARBIDE SEMICONDUCTOR DEVICE

CROSS REFERENCE TO RELATED APPLICATIONS

This application claims priority from Japanese application Serial No. JP 2006-155624, filed on Jun. 5, 2006.

BACKGROUND OF THE INVENTION

A. Field of the Invention

The present invention relates to a method for manufacturing a silicon carbide (hereinafter referred to as SiC) semiconductor device for a high breakdown voltage and large current, especially to a method for manufacturing a SiC semiconductor device having a trench gate structure.

B. Description of the Related Art

A power MOSFET and an insulated gate bipolar transistor (hereinafter referred to as IGBT) are well-known and widely used as silicon (hereinafter referred to as Si) power semiconductor devices for an inverter and an AC power control. However, it has been widely observed that a material of Si as a semiconductor material has already neared its physical property limit in respect to semiconductor characteristics in the power semiconductor device. Thus, a SiC semiconductor, which has a physical property limit higher than that of the Si semiconductor, has received attention. As compared with Si semiconductor material, SiC (especially its crystal form of 4H-SiC) semiconductor material has excellent features in dielectric breakdown electric field, band gap, thermal conductivity and temperature of an intrinsic semiconductor, with these properties of the SiC semiconductor material being respectively higher in one digit, in 2.9 times, in 3.2 times and in 3 to 4 times than those of the Si semiconductor material. Therefore, superior performance of the SiC semiconductor material is greatly shown its better physical property limits in comparison with the Si semiconductor material in the case of using the SiC semiconductor material as a substrate material, especially for a power device. As a result, in a power device using a SiC semiconductor substrate, a high breakdown voltage characteristic and a low on-resistance characteristic can be simultaneously achieved in spite of an assumption that it is difficult to achieve these characteristics at the same time, there being a trade off relationship between them in the Si semiconductor device, and there have been many approaches to the manufacturing in recent years. However, there are still a lot of problems which are not solved for an actual manufacturing process to manufacture or practically use this as a power device.

On the other hand, in recent years a trench gate structure has been used as one of high density patterning techniques that has been developed to reduce on-resistance or an on-state voltage of the power MOSFET and the IGBT using the Si semiconductor. FIG. 7 shows a cross-sectional view of a unit part of the MOSFET having the trench gate structure. The trench MOSFET is a device including as main elements n-type high resistance layer 102 formed on a principle surface of n-type substrate 101, p well layer 103, n emitter region 104 formed in a surface layer of p well layer 103, trench 105 formed by etching to a depth reaching n type high resistance layer 102 from a surface of n emitter region 104, gate oxide film 106 formed on a surface of trench 105, and gate electrode 107 of conductive polycrystalline silicon (polysilicon) buried in trench 105 interposing gate oxide film 106 between trench 105 and gate electrode 107. An etch process must precisely form width, a depth and a flat surface of trench 105 to produce the semiconductor characteristics in manufacturing, and thus the etch process is very important. In addition, because a required depth of trench 105 is different in response to the breakdown voltages, it is necessary for trench 105 to have at least several micrometers of depth at several hundred volts in the breakdown voltage. When a high breakdown voltage device is manufactured, an etching technique to enable formation of the required deep trench 105 and the etch process technique to control to make the preferred flat surface of trench 105 already have been approximately established in the Si semiconductor substrate.

However, because the SiC semiconductor substrate material according to the present invention is one of materials which is so difficult to etch that even practical wet etching has yet to be discovered, an etching control technology is not established enough in comparison with the above-described Si semiconductor substrate. It is disclosed in Japanese Patent Nos. 2992596, 2661390, 3593195 and 3761546 and Japanese Patent Laid-open (Publication) No. 8-12286 (hereinafter respectively referred to as Documents 1, 2, 3, 4 and 5, respectively) that it is possible to etch the SiC semiconductor substrate by dry etching such as reactive ion etching (hereinafter referred to as RIE) for the present. Document 2 (Japanese Patent No. 2661390) corresponds to U.S. Pat. No. 5,234,537 and European Patent No. 504912B1, and Document 5 (Japanese Patent Laid-open (Publication) No. 8-12286) corresponds to WO 02/099870 A1. However, because the etch rate of SiC semiconductor substrate is low in the RIE dry etching technology (the etching rate with the use of a mixed gas of carbon tetrafluoride ($CF_4$) and oxygen ($O_2$) is around 50 nm/minute), and etching selectivity of the SiC semiconductor substrate to the material of a mask is also small, it is difficult to form a trench needing selective etching with the use of a mask, especially the deep trench. For example, it is difficult to etch a trench even to a depth of several micrometers.

On the other hand, it is known that dry etching with the use of high density plasma by an inductively coupled plasma (hereinafter referred to as ICP) method has an effective etching rate, but it still takes a long time to form the above-described deep trench (of several micrometers). Using the ICP method with a mixed gas of carbon tetrafluoride ($CF_4$) and oxygen ($O_2$), and using an aluminum (Al) film or a nickel film having etching selectivity as the mask, allows the etching rate to be more than 100 nm/minute. However, there is a problem that the etched surface becomes rough due to contamination by mask metal and a micro mask adheres on the etched surface.

If a silicon dioxide film (hereinafter referred to as $SiO_2$) is used as the etching mask in the above-described ICP dry etching, the problem caused by the metal mask does not occur. But when the selectivity ratio of the SiC semiconductor substrate to the $SiO_2$ is not high enough chemically and physically, the mask is etched away before the etching target depth to form the trench is reached in the SiC semiconductor substrate. Because the selectivity ratio of the SiC semiconductor substrate to the $SiO_2$ is around 3 when the SiC semiconductor substrate is etched and $SiO_2$ of 2 μm in thickness is used as the mask in the ICP dry etching presently used, the $SiO_2$ as the mask disappears when the SiC semiconductor substrate is etched to a depth of around 6 μm, so that it is not possible to form a trench that is deeper than that. In addition, if the film thickness of the mask is made thicker than 2 μm, it causes new problems, because it takes a lot of times to form the $SiO_2$ mask and further it is difficult to pattern with good accuracy for the thicker mask material. Therefore it cannot be simply concluded that the problems are easily resolved by increasing the thickness of the $SiO_2$ mask. Thus, the practical level for the depth of the trench is around 3 μm in current ICP dry etching with respect to the SiC semiconductor substrate.

Japanese Patent Laid-Open No. 2005-56868 (hereinafter referred to as Document 6) discloses that on a bottom surface of a deep trench formed in SiC semiconductor substrate 110 by dry etching with the use of ICP high density plasma, microtrench (subtrench) 112 is formed in a convexo-concave shape having an acute angle on the bottom surface of trench 111 as shown in FIG. 8. Further when the MOS device including the trench gate structure having microtrench 112 on the bottom surface of trench 111 is operated, dielectric breakdown occurs due to electric field concentration on an acute angle part of microtrench 112, and there is a major problem because the designed breakdown voltage cannot be obtained. In addition, Document 6 (Japanese Patent Laid-Open No. 2005-56868) discloses that the trench is formed in the SiC semiconductor substrate by a first ICP dry etching with the use of a mixed gas of carbon tetrafluoride ($CF_4$) and oxygen ($O_2$) to use the aluminum (Al) film as the mask, and a microtrench on a surface of the bottom of the trench formed by a first dry etching is relaxed by a second ICP dry etching on the entire surface of the SiC semiconductor substrate after removing the aluminum (Al) film as the mask.

Thus, no method is disclosed in Documents 1 through 5 in which a deep trench is formed by using a mask and in which etching selectivity of the SiC semiconductor substrate to the mask is large. Practical utility is low since it takes too much time to form the deep trench in the SiC semiconductor substrate due to the small etching rate in the etching method in description of Documents 1 through 5. Further, in Documents 1 to 5, there is not even a suggestion to flatly etch the trench bottom without convexo-concave of the acute angle so that the breakdown voltage characteristic of the MOS semiconductor device having the trench gate structure has not a bad influence.

In addition, a depth of the trench is around 3 μm in Document 6, and it is not explained that micro etching is improved by the second ICP dry etching by extent that the breakdown voltage characteristic does not have the bad influence in the case that the trench is formed in depth of more than 3 μm. Moreover, because the metal mask of aluminum or nickel is used as the etching mask in description in Document 6, metal contamination on the surface in the trench is not avoided. It is desirable to avoid using a metal mask.

The present invention is directed to overcoming or at least reducing the effects of one or more of the problems set forth above.

SUMMARY OF THE INVENTION

The present invention provides in view of such problems a method for manufacturing a SiC semiconductor device including a process of high practical utility that allows the trench to be deeply etched to a depth of more than 3 μm in a SiC semiconductor substrate, using a dry etch process that allows the trench bottom to be flat without forming the convexo-concave shape in the trench bottom having the acute angle which has an influence on a breakdown voltage characteristic due to electric field concentration being caused.

A method for manufacturing a silicon carbide (SiC) semiconductor device according to a first aspect of the invention comprises steps of: forming a well layer of a conductivity type that is different from a SiC substrate on the SiC substrate; forming selectively an emitter region of the same conductivity type as the SiC substrate in a surface layer of the well layer; forming a selective etch mask of necessity in a surface of a SiC laminated semiconductor substrate comprising the SiC substrate, the well layer and the emitter region by using a silicon dioxide film ($SiO_2$); and forming a trench for a trench gate structure by dry etching with the use of a high-density inductive coupled plasma (ICP) from a surface of the emitter region being exposed to the surface of the SiC laminated semiconductor substrate; wherein the dry etching with the use of the high-density ICP comprising a first dry etching and a second dry etching different from the first dry etching in an etching condition.

The method for manufacturing the SiC semiconductor device according to a second aspect of the invention is characterized in that, in the first aspect of the invention, the high-density ICP is an ICP which is obtained by ionizing a mixed gas containing fluoride, oxygen and inert gas as a major ingredient.

The method for manufacturing the SiC semiconductor device according to a third aspect of the invention is characterized in that, in the first aspect or the second aspect of the invention, the etching condition of the first dry etching comprises (a) using the mixed gas containing sulfur hexafluoride ($SF_6$), oxygen ($O_2$) and argon (Ar) as the major ingredient and (b) etching the trench while heating the SiC laminated semiconductor substrate at 70° C. to 100° C., wherein an argon (Ar) flow rate is 50% to 80% of a total mixed gas flow rate, and a $SF_6/O_2$ flow ratio is 1/2 to 7/10.

The method for manufacturing the SiC semiconductor device according to a fourth aspect of the invention is characterized in that, in the third aspect of the invention, the etching condition of the second dry etching is the same as the etching condition of the first dry etching except that the $SF_6/O_2$ flow ratio is 1/1, and ICP electric power is not more than ½ of that of the etching condition of the first dry etching and bias electric power to apply to the SiC laminated semiconductor substrate side is increased.

The method for manufacturing the SiC semiconductor device according to a fifth aspect of the invention is characterized in that, in the fourth aspect of the invention, a thickness of the $SiO_2$ used as a mask is 0.5 μm to 3 μm, and after the first dry etching, the second dry etching is performed with maintaining a pressure reduction state of necessity in a dry etching apparatus, or after opening the dry etching apparatus in atmospheric pressure once, the second dry etching is performed after making the pressure reduction state of the necessity again in the dry etching apparatus.

The method for manufacturing the SiC semiconductor device according to a sixth aspect of the invention is characterized in that, in the second aspect of the invention, the dry etching is performed in pressure of less than or equal to 0.5 Pa as the etching condition.

According to the present invention, discharge is enabled with low pressure (1 Pa) by adding argon (Ar) gas to sulfur hexafluoride ($SF_6$) gas and oxygen ($O_2$) gas, and when a sulfur hexafluoride ($SF_6$)/oxygen ($O_2$) flow ratio is made to 60%, the temperature in etching is raised to 80° C. Further a total mixed gas flow rate is controlled, and then an etching selectivity ratio can be extremely increased to 8.7. As a result, not only can a deep trench of more than 3 μm and especially more than 10 μm be formed, but also a shape abnormality called a microtrench can be eliminated substantially by using etching conditions of two steps. The microtrench is the shape abnormality which occurs on the bottom of the trench and which seems to be a convexo-concave shape having an acute angle which has an influence on the breakdown voltage characteristic.

As a result, in manufacturing of the trench MOSFET, the method for manufacturing the silicon carbide semiconductor device which the breakdown voltage between a gate and an emitter is improved can be provided by applying the above-described trench etch process and manufacturing.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
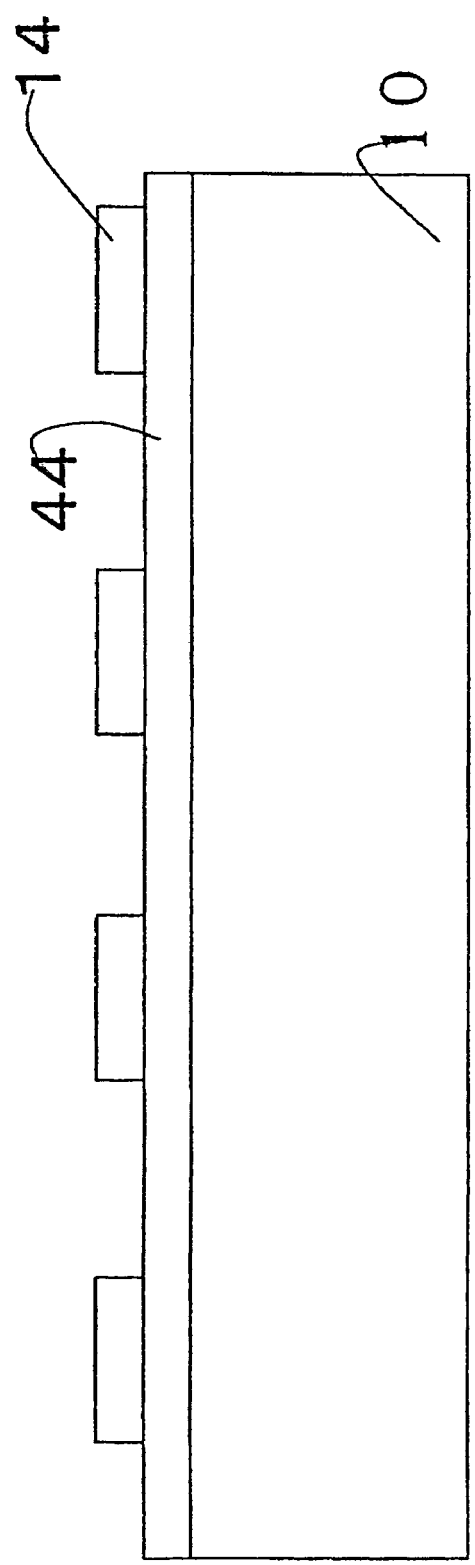
FIG. 1 is a cross-sectional view of a silicon carbide (SiC) laminated semiconductor substrate at the step which an etching mask is formed on the SiC laminated semiconductor substrate according to a method for manufacturing a silicon carbide semiconductor device of the present invention.
Figure 2:
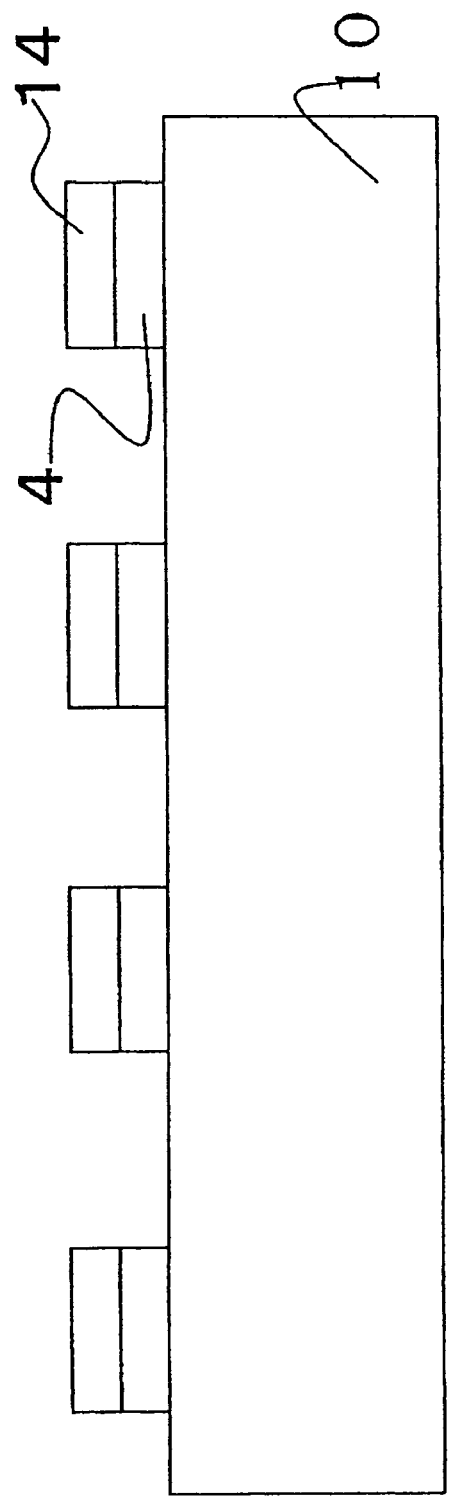
FIG. 2 is a cross-sectional view of the SiC laminated semiconductor substrate at the step which a photoresist pattern is formed before forming the etching mask according to the method for manufacturing the SiC semiconductor device of the present invention.
Figure 3:
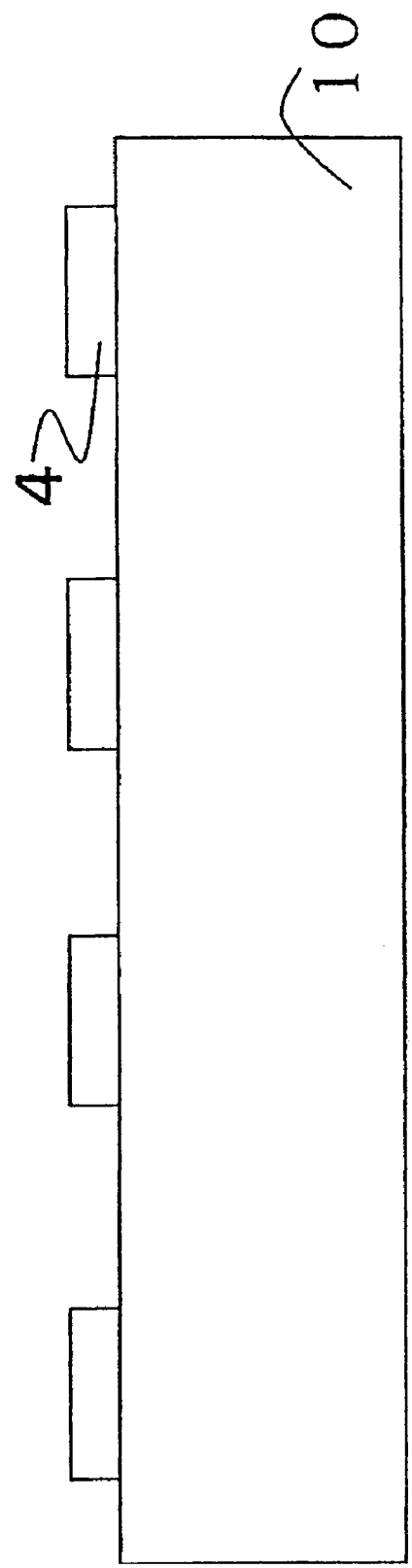
FIG. 3 is a cross-sectional view of the SiC laminated semiconductor substrate at the step which the etching mask is formed on the SiC laminated semiconductor substrate according to the method for manufacturing the SiC semiconductor device of the present invention.
Figure 4:
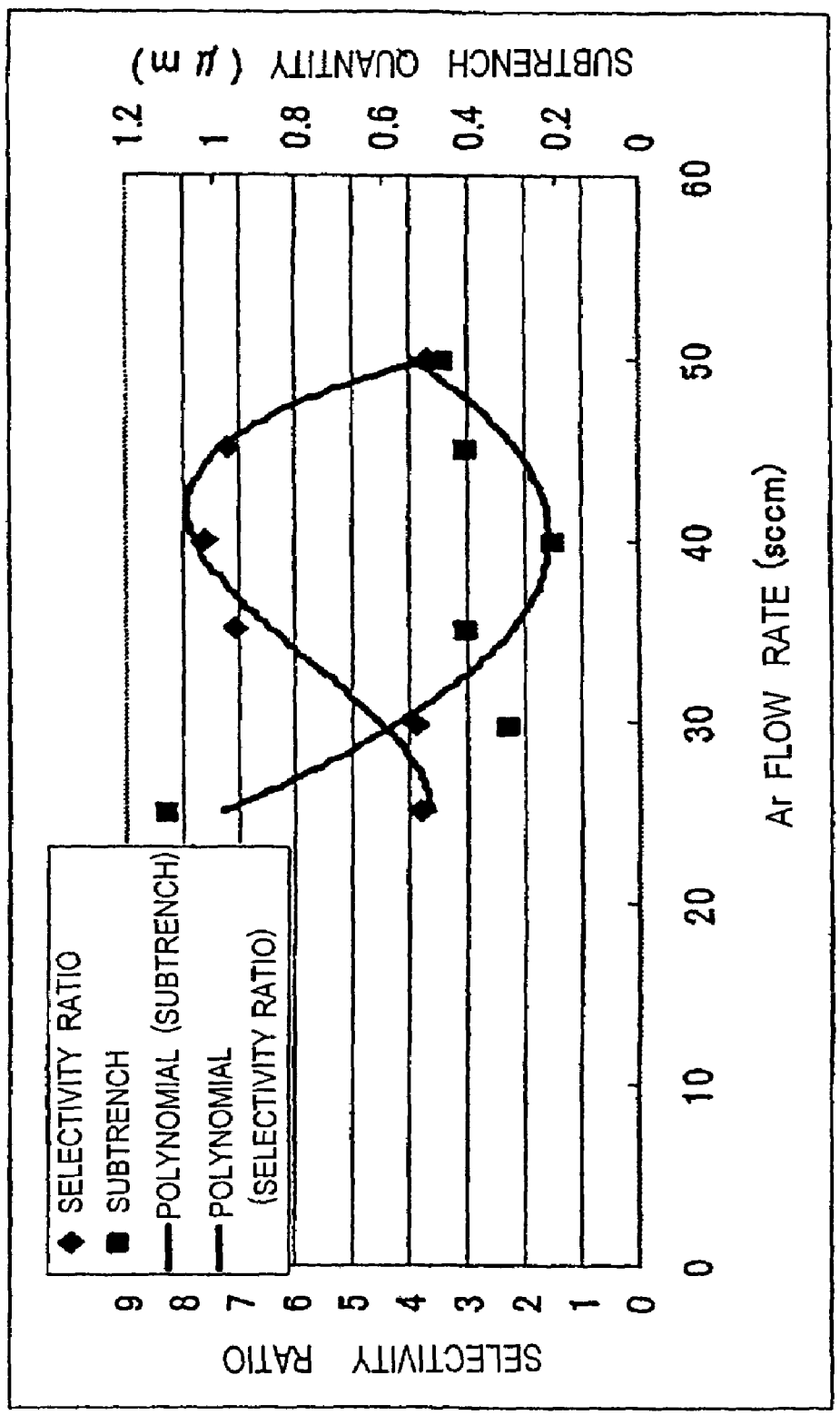
FIG. 4 is a relationship graph between etching time of dry etching and the quantity of dry etching according to a first embodiment of the present invention.
Figure 5:
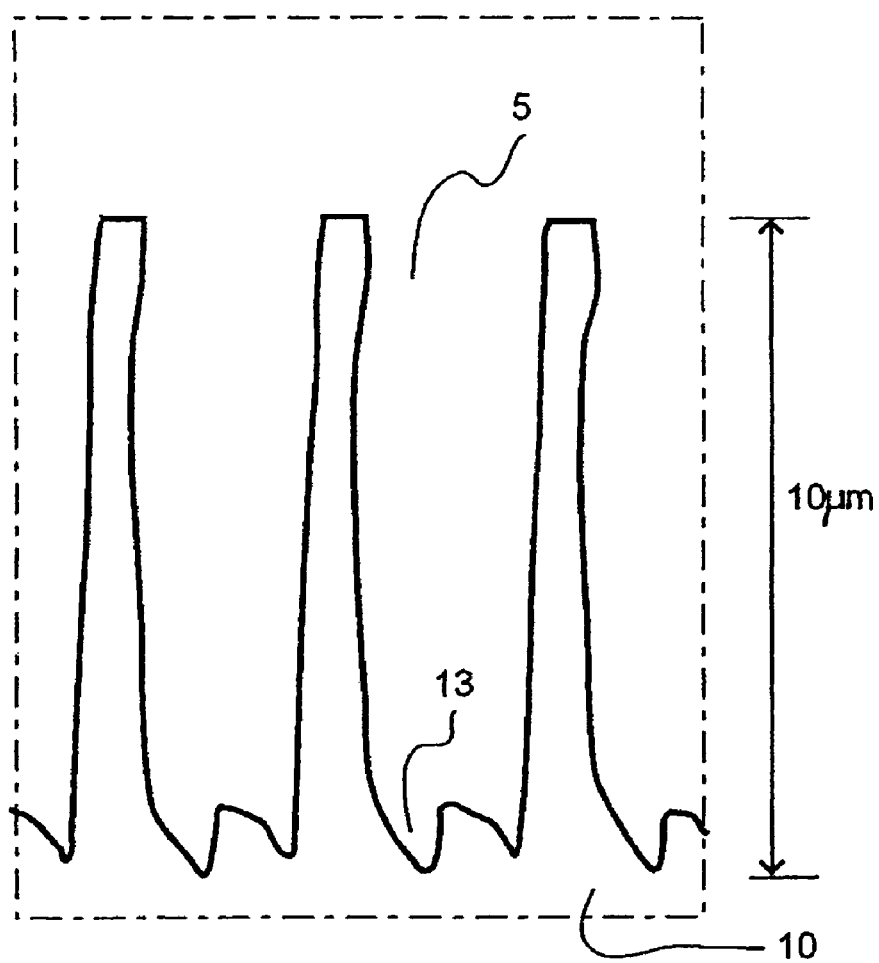
FIG. 5 is a cross-sectional view of a trench shape when the SiC laminated semiconductor substrate is etched under a first condition according to the first embodiment of the present invention.
Figure 6A:
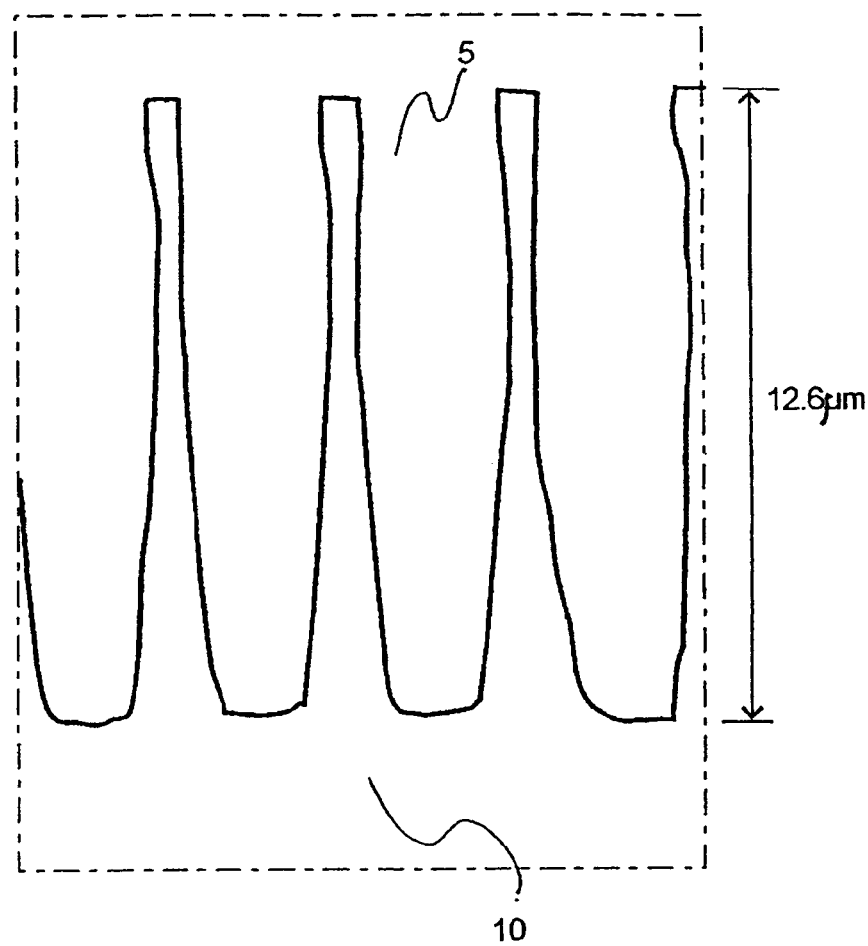
FIG. 6A is a cross-sectional view of the trench shape when the SiC laminated semiconductor substrate is etched under a second condition after being etched under the first condition according to the first embodiment of the present invention.
Figure 9:
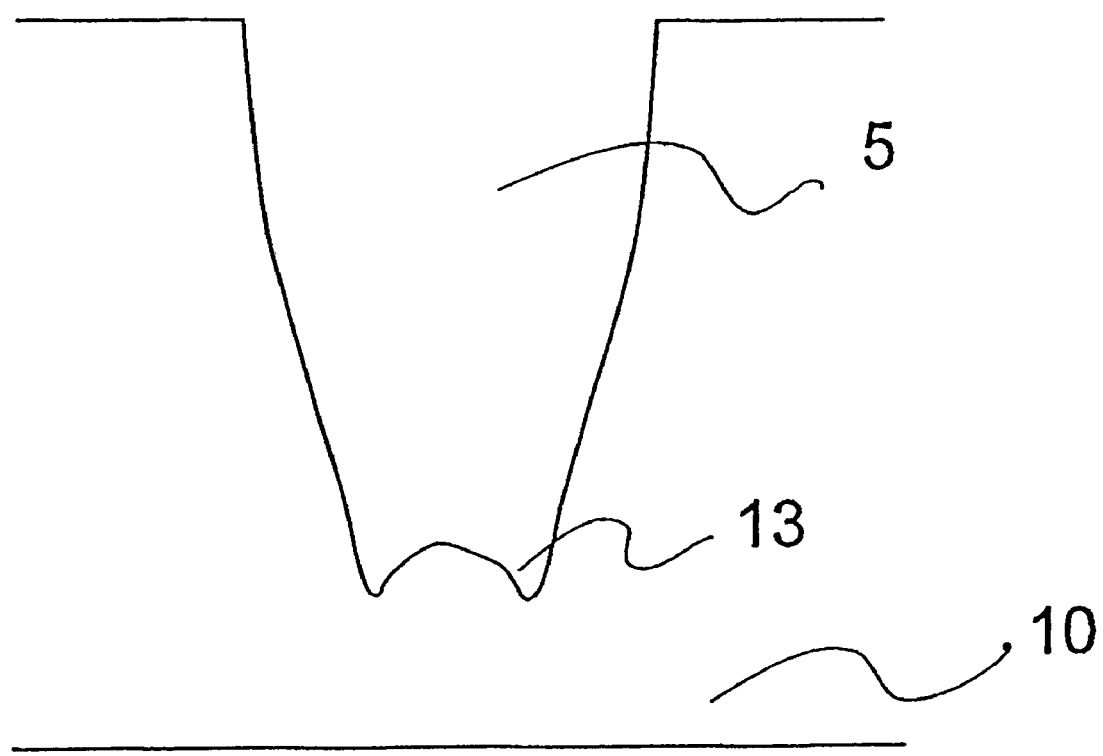
FIG. 9 is a cross-sectional view of the trench shape when the SiC laminated semiconductor substrate is etched under a first condition according to a third embodiment of the present invention.
Figure 10:
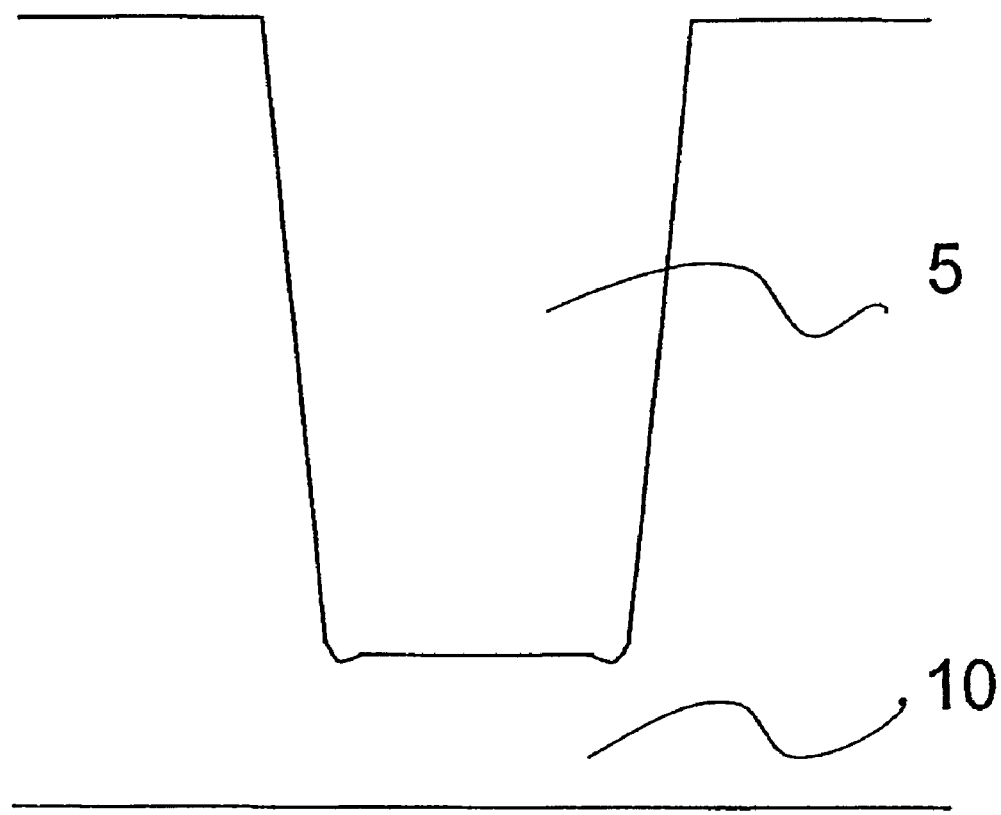
FIG. 10 is a cross-sectional view of the trench shape when the SiC laminated semiconductor substrate is etched under a second condition after being etched under the first condition according to the third embodiment of the present invention.

Preferred embodiments of a method for manufacturing a silicon carbide (SiC) semiconductor device according to the present invention will now be explained in detail with reference to the attached drawings. The present invention is not limited to description of embodiments to explain below unless the summary is exceeded. FIG. 1 is a cross-sectional view of a silicon carbide (SiC) laminated semiconductor substrate at the step in which a photoresist is patterned so that an etching mask is formed on a silicon dioxide film ($SiO_2$) on the SiC laminated semiconductor substrate according to the method for manufacturing the SiC semiconductor device of the present invention. FIG. 2 is a cross-sectional view of the SiC laminated semiconductor substrate at the step in which the $SiO_2$ is photoetched and formed as an etching mask pattern according to the method for manufacturing the SiC semiconductor device of the present invention. FIG. 3 is a cross-sectional view of the SiC laminated semiconductor substrate at the step in which the $SiO_2$ is formed as the etching mask pattern and the photoresist is removed according to the method for manufacturing the SiC semiconductor device of the present invention. FIG. 4 is a relationship graph between argon (Ar) flow rate and a ratio of a etching rate of the SiC laminated semiconductor substrate to the $SiO_2$ (hereinafter the ratio is referred to as the selectivity ratio) and between argon (Ar) flow rate and a subtrench quantity in dry etching according to a first embodiment of the present invention. FIG. 5 is a cross-sectional view of a trench shape when the SiC laminated semiconductor substrate is etched under a first condition of dry etching according to the first embodiment of the present invention. FIG. 6A is a cross-sectional view of the trench shape when the SiC laminated semiconductor substrate is etched under a second condition of dry etching after being etched under the first condition of dry etching according to the first embodiment of the present invention. FIG. 9 is a cross-sectional view of the trench shape when the SiC laminated semiconductor substrate is etched under a first condition of dry etching according to a third embodiment of the present invention. FIG. 10 is a cross-sectional view of the trench shape when the SiC laminated semiconductor substrate is etched under a second condition of dry etching after being etched under the first condition of dry etching according to the third embodiment of the present invention.

First Embodiment

Figure 11:
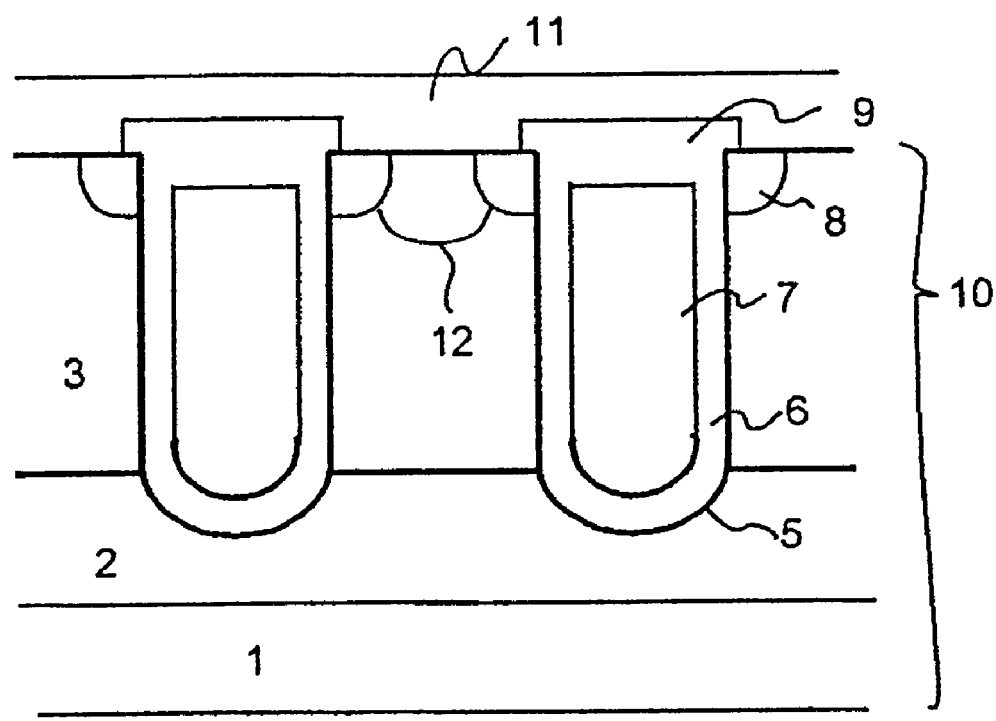
FIG. 11 is a cross-sectional view of a completed trench MOS semiconductor device according to the first embodiment of the present invention.

A first embodiment of the method for manufacturing a MOS semiconductor device having a trench gate structure according to the present invention will now be explained in detail with reference to the attached drawings. Because a manufacturing process except for a trench etch process according to the present invention conforms with a conventional method for manufacturing the MOS semiconductor device, the manufacturing process except for the trench etch process according to the present invention is simply described without explaining detailed manufacturing conditions and so on. FIG. 11 is a cross-sectional view of a completed trench MOS semiconductor device according to the first embodiment of the present invention. SiC laminated semiconductor substrate 10 shown in FIG. 11 is formed by accumulating high resistance SiC layer 2 of n type on SiC substrate 1 of the n type by epitaxial growth, and further formed by accumulating SiC layer 3 of a p type on high resistance SiC layer 2 by epitaxial growth. Here, SiC epitaxial layer 3 becomes p well layer 3. As shown in FIGS. 1 through 3 showing a photoetching process of $SiO_2$, after silicon dioxide film ($SiO_2$) 44 which becomes a mask for trench etching is formed on the SiC laminated semiconductor substrate 10 formed of the above-mentioned semiconductor layers by a chemical vapor deposition (hereinafter referred to as CVD) method, photoresist 14 is formed as shown in FIG. 1, and silicon dioxide film ($SiO_2$) pattern 4 for trench etching is formed by photolithography as shown in FIG. 2. Photoresist 14 is removed as shown in FIG. 3, and trench 5 of around 10 μm in depth is formed by dry etching from a surface of SiC laminated semiconductor substrate 10 to high resistance SiC epitaxial layer 2 of the n-type directly beneath p well 3 using formed $SiO_2$ pattern 4 as the mask. The trench etch process will be explained in detail later. The inside of trench 5 that is formed is cleaned afterwards, and after soft etching and forming a sacrifice oxide film (not illustrated) to remove a damage layer (not illustrated) due to etching, the sacrifice oxide film and $SiO_2$ pattern 4 of the mask are removed. Gate oxide film 6 and polycrystalline silicon gate electrode 7 are formed sequentially. Gate electrode 7 is buried in trench 5 from the surface of SiC laminated semiconductor substrate 10 by forming a polycrystalline silicon into which phosphorus is doped, and is formed by etch back of the polycrystalline silicon on the surface of SiC laminated semiconductor substrate 10. Further patterning is performed so that $p^+$ contact region 12 is formed in a surface of $n^+$ emitter region 8 and p well 3, and activation is performed by heat treatment after an n type dopant and a p type dopant are respectively implanted. Interlayer insulation film 9 insulating between gate electrode 7 and emitter electrode 11 is formed in SiC laminated semiconductor substrate 10, and an aluminum film is evaporated to form emitter electrode 11 and a pad of gate electrode 7 after patterning, and a drain electrode (not illustrated) is formed on a back surface by sputtering. Thus the SiC-MOS semiconductor device having the trench gate structure according to the method for manufacturing of the present invention shown in FIG. 11 is completed.

In the method for manufacturing the MOS semiconductor device having the trench gate structure according to the present invention, the trench etching has special characteristics, so that the trench etching will now be especially explained in detail. FIG. 1 shows a cross-sectional view of SiC laminated semiconductor substrate 10 on which $SiO_2$ 44 and photoresist 14 are laminated. At first photoresist 14 is applied on the entire surface of $SiO_2$ 44 by a spin coat method after $SiO_2$ 44 of 2.2 μm in thickness is formed on SiC laminated semiconductor substrate 10 by the CVD method. Photoresist 14 is baked at 85° C. for 30 minutes in a clean oven afterwards. After baking, initial exposure is performed using a photo mask having a predetermined pattern in an exposure apparatus with the use of ultra-violet rays. After initial exposure, the entire SiC laminated semiconductor substrate is exposed entirely without using the mask after baking at 115° C. for 15 minutes. After the entire exposure, unnecessary photoresist except for the desired trench mask pattern is removed by developing, so that a pattern of photoresist 14 having the cross section shown in FIG. 1 is formed.

After pattern formation of photoresist 14, $SiO_2$ 44 is etched using photoresist 14 as the mask with an ICP dry etching apparatus which is not illustrated. Etching is performed by introducing fluoroform ($CHF_3$) gas at 15 sccm at ICP electric power 135 W, at bias electric power 15 W to the SiC laminated semiconductor substrate side, and at a pressure of 1 Pa. A patterned line width is 2 μm in the embodiment. FIG. 2 shows configuration of $SiO_2$ mask 4 obtained by the above photo process. After dry etching of the $SiO_2$ of FIG. 2, the remaining photoresist 14 is removed by dipping into resist-removing liquid of 70° C., so that SiC laminated semiconductor substrate 10 on which the $SiO_2$ 4 is patterned is formed as shown in FIG. 3.

Second, ICP dry etching is performed from the surface of SiC laminated semiconductor substrate 10 on which the $SiO_2$ is formed. According to the present invention, dry etching of SiC laminated semiconductor substrate 10 is performed in two steps with a change in the etch conditions. Etching of around ⅘ of the target depth is desirable under the etching condition of a first dry etching. In the case of deep etching to be more than 3 μm in depth, it is desirable that a ratio of the etching rate of the SiC laminated semiconductor substrate to that of the $SiO_2$ used as the mask (hereinafter the ratio is referred to as selectivity ratio) is large as possible.

The etching conditions of the large selectivity ratios are investigated. The selectivity ratios (ratio of etching quantity of the SiC laminated semiconductor substrate to that of the $SiO_2$) are shown in Table 1, in which gas species, gas flow rate, ICP electric power, bias electric power, pressure (barometric pressure) in the etching apparatus and the temperature used for dry etching according to the present invention are changed.

TABLE 1

| Condition | Gas species and gas flow rate (sccm) | ICP power (W) | Bias power (W) | Pressure (Pa) | Temperature (° C.) | Selectivity ratio |
|---|---|---|---|---|---|---|
| 1 | $SF_6/O_2/Ar$ = 10/10/0 | 500 | 15 | 3 | 30 | 2.6 |
| 2 | $SF_6/O_2/Ar$ = 10/10/20 | 500 | 15 | 3 | 30 | 3.6 |
| 3 | $SF_6/O_2/Ar$ = 10/10/20 | 500 | 15 | 1 | 30 | 4.1 |
| 4 | $SF_6/O_2/Ar$ = 10/10/30 | 500 | 15 | 1 | 30 | 4.6 |
| 5 | $SF_6/O_2/Ar$ = 6/10/30 | 500 | 15 | 1 | 30 | 5.2 |
| 6 | $SF_6/O_2/Ar$ = 6/10/30 | 500 | 15 | 1 | 80 | 5.8 |
| 7 | $SF_6/O_2/Ar$ = 6/10/40 | 500 | 15 | 1 | 80 | 7.6 |
| 8 | $SF_6/O_2/Ar$ = 5/8/30 | 500 | 15 | 1 | 80 | 8.7 |
| 9 | $SF_6/O_2/Ar$ = 4.2/8/28 | 500 | 15 | 0.4 | 80 | 10.4 |

When condition 1 and condition 2 shown in Table 1 are compared, it can be seen that the selectivity ratio improves to 3.6 from 2.6 when argon (Ar) gas is doped in a mixed gas of sulfur hexafluoride ($SF_6$) and oxygen ($O_2$). When condition 2 and condition 3 are compared, the selectivity ratio further improves to 4.1 from 3.6 when pressure is lowed to 1 Pa from 3 Pa. When condition 3 and condition 4 are compared, the selectivity ratio further improves to 4.6 from 4.1 when an additive argon (Ar) flow rate is increased to 30 sccm from 20 sccm. When condition 4 and condition 5 are compared, it can be seen that particularly the selectivity ratio improves to 5.2 from 4.6 when a sulfur hexafluoride ($SF_6$) flow rate is lowered to 6 sccm from 10 sccm and the sulfur hexafluoride ($SF_6$) flow rate is lower than an oxygen ($O_2$) flow rate. When condition 5 and condition 6 are compared, it is found that, more particularly, the selectivity ratio improves to 5.8 from 5.2, when the temperature in etching is increased to 80° C. from 30° C. in the sulfur hexafluoride ($SF_6$) flow rate being lower than the oxygen ($O_2$) flow rate. When condition 6 and condition 7 are compared, it is found that, even more particularly, the selectivity ratio improves to 7.6 from 5.8 when the argon (Ar) flow rate is increased in the sulfur hexafluoride (SF$_6$) flow rate being lower than the oxygen (O$_2$) flow rate at 80° C. In view of condition 8, it is found that, more even more particularly, the selectivity ratio improves to 8.7 from 7.6 when the total mixed gas flow rate is reduced without changing gas mixing proportion of condition 7. In view of condition 9, it is found that, more even more particularly, the selectivity ratio improves to 10.4 when the total mixed gas flow rate is reduced less than that of condition 8 and pressure is reduced to 0.4 Pa without changing gas mixing proportion of condition 7. As above described, argon (Ar) gas is added in the mixed gas of sulfur hexafluoride (SF$_6$) and oxygen (O$_2$), and pressure is 1 Pa, preferably less than or equal to 0.5 Pa, and the argon (Ar) flow rate is appropriate, and the sulfur hexafluoride (SF$_6$) flow rate is lower than the oxygen (O$_2$) flow rate, and the etching temperature is 80° C. and the total mixed gas flow rate is controlled. Thus the selectivity ratio can be improved greatly. As a result, it is proven that deep etching of more than 10 μm can be performed practically in the SiC laminated semiconductor substrate by a SiO$_2$ mask of only 2 μm in thickness.

FIG. 4 shows the selectivity ratio and the microtrench (subtrench) quantity (μm) when the sulfur hexafluoride (SF$_6$)/oxygen (O$_2$) flow ratio is constant (6 sccm/10 sccm) and the additive argon (Ar) flow rate is changed. It is found in FIG. 4 that the selectivity ratio becomes greatest when the argon (Ar) flow rate is around 40 sccm, and on the other hand, the microtrench (subtrench) quantity becomes small when the argon (Ar) flow rate is more than 30 sccm.

On the basis of what is shown in FIG. 4, according to the first embodiment, the trench is etched to around ⅘ (about 10 μm) of the target depth under the condition of a first dry etching comprising: the mixed gas of sulfur hexafluoride (SF$_6$), oxygen (O$_2$), and argon (Ar); the sulfur hexafluoride (SF$_6$) flow rate of 5 sccm, the oxygen (O$_2$) flow rate of 8 sccm and the argon (Ar) flow rate of 30 sccm; pressure of 1 Pa; ICP electric power of 500 W; bias electric power of 15 W applied to the SiC laminated semiconductor substrate side; and the temperature of the SiC laminated semiconductor substrate of 80° C. heated with a heater. FIG. 5 shows a cross-sectional view of SiC laminated semiconductor substrate 10 in which an actual etching shape is observed in the case of an etching depth of 10 μm under the condition of the first dry etching. The etching rate under the condition of the first dry etching is around 0.6 μm/minute. A high etching speed can be achieved in comparison with a conventional speed of 0.05 μm/minute, but in the cross-sectional shape of trench 5, the bottom of the trench narrows slightly and microtrench 13 is generated in the bottom. After etching around ⅘ (10 μm in the embodiment) of the target depth under the first etching condition, etching under a second etching condition is performed in vacuum (a reduced pressure state) which continues to be held without taking out the sample (SiC laminated semiconductor substrate 10) from the etching apparatus. The reduced pressure state is maintained with the first embodiment, but it is ensured separately that there is no problem in the case of being left open to the atmosphere. Trench 5 is etched further in depth of 2.5 μm to add to 10 μm of the first etching condition under the second etching condition comprising: using the mixed gas of sulfur hexafluoride (SF$_6$), oxygen (O$_2$) and argon (Ar); introducing the sulfur hexafluoride (SF$_6$) flow rate of 2 sccm, the oxygen (O$_2$) flow rate of 2 sccm and the argon (Ar) flow rate of 8 sccm; pressure of 1 Pa; ICP electric power of 200 W; bias electric power of 20 W applied to the SiC laminated semiconductor substrate side; and the temperature of the SiC laminated semiconductor substrate of 80° C. heated with a heater (a depth of the trench etched under the first etching condition and the second etching condition is 12.5 μm in total). FIG. 6A is a cross-sectional view of the SiC laminated semiconductor substrate showing trench 5 in the case of etching under the second etching condition successively after etching under the first etching condition. The etching rate under the second etching condition is lowered to around 0.2 μm/minute, but it is found that microtrench 13 can be greatly decreased by adding an etch under the second etching condition. The etching depth is actually 12.6 μm in total. It is found that breakdown voltage reduction due to electric field concentration in the bottom of the trench is extremely small in the trench MOS semiconductor device formed by the trench etch process.

As the above result, according to the first embodiment, it is found that not only can a deep trench of more than 3 μm and further more than 10 μm in the SiC laminated semiconductor substrate be achieved by the process of high utility but also flat etching can be achieved without forming the convexoconcave shape having the acute angle which has the influence on the breakdown voltage characteristic due to electric field concentration being caused in the bottom of the trench.

Second Embodiment

Figure 6B:
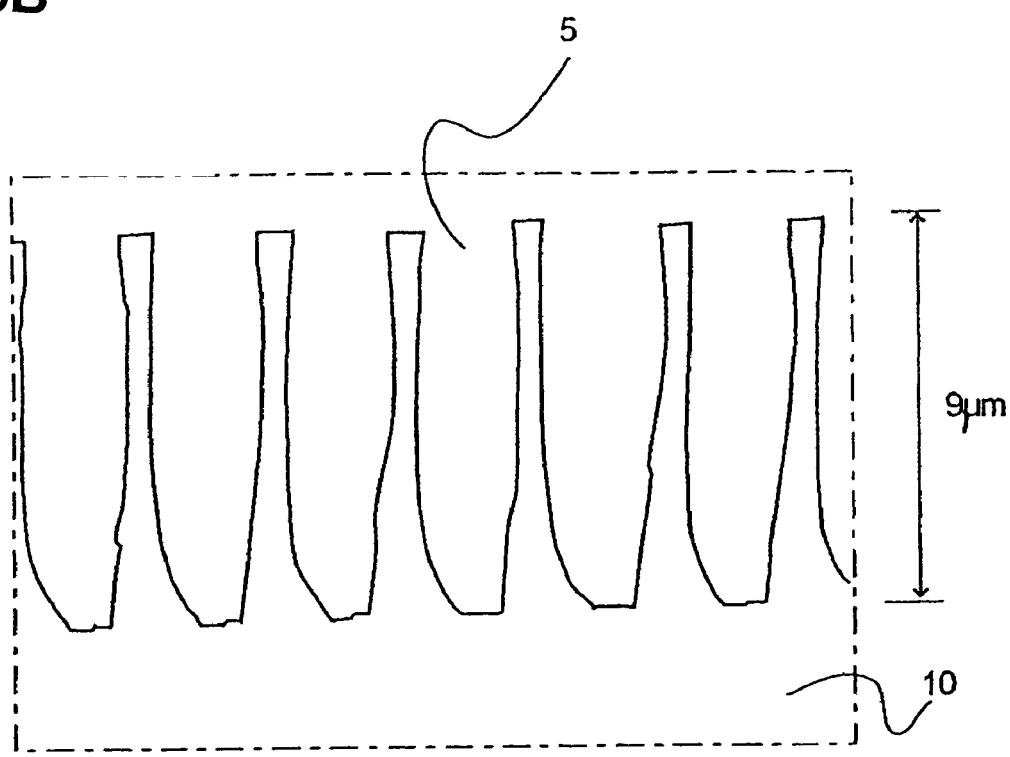
FIG. 6B is a cross-sectional view of the trench shape when the SiC laminated semiconductor substrate is etched under a first condition according to a second embodiment of the present invention.
Figure 6C:
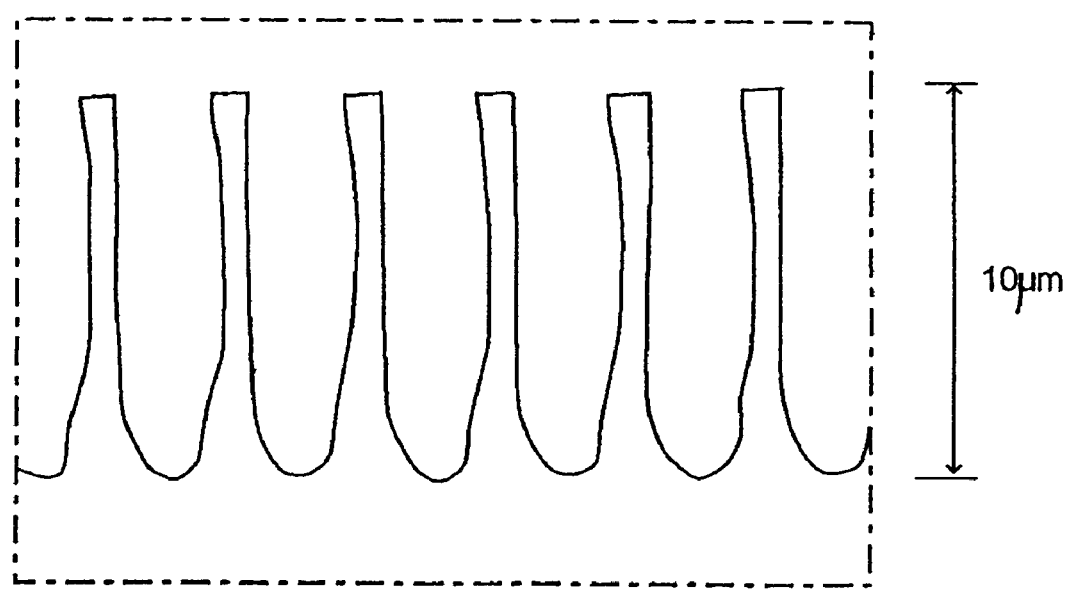
FIG. 6C is a cross-sectional view of the trench shape when the SiC laminated semiconductor substrate is etched under a second condition after being etched under the first condition according to a second embodiment of the present invention.
Figure 7:
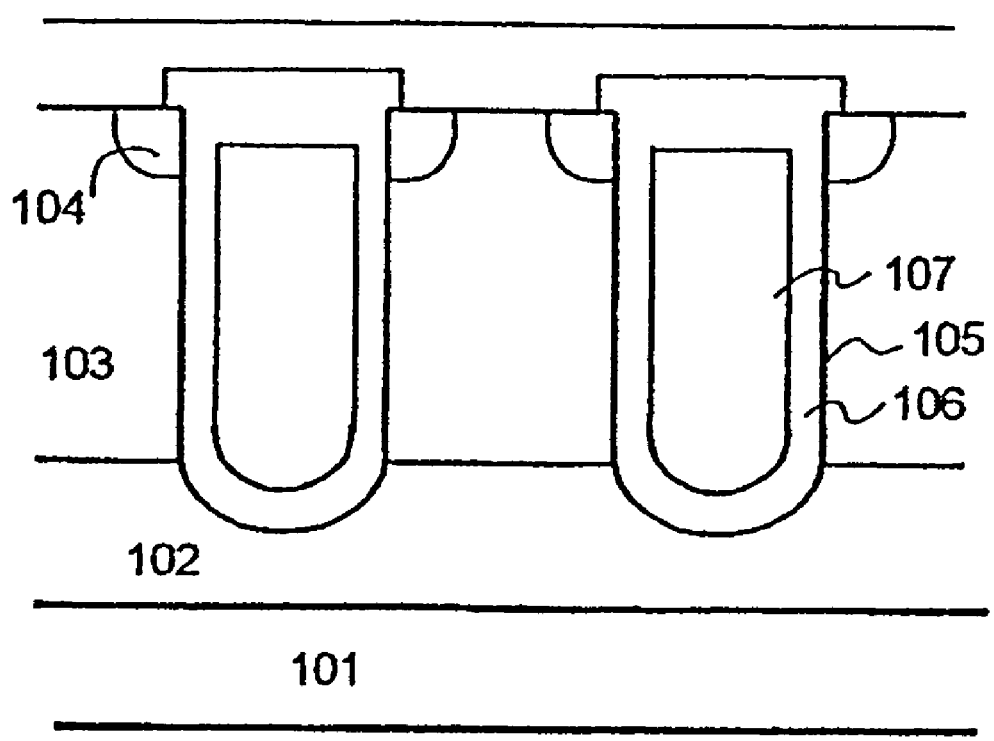
FIG. 7 is a cross-sectional view of a conventional and general trench MOS semiconductor device.
Figure 8:
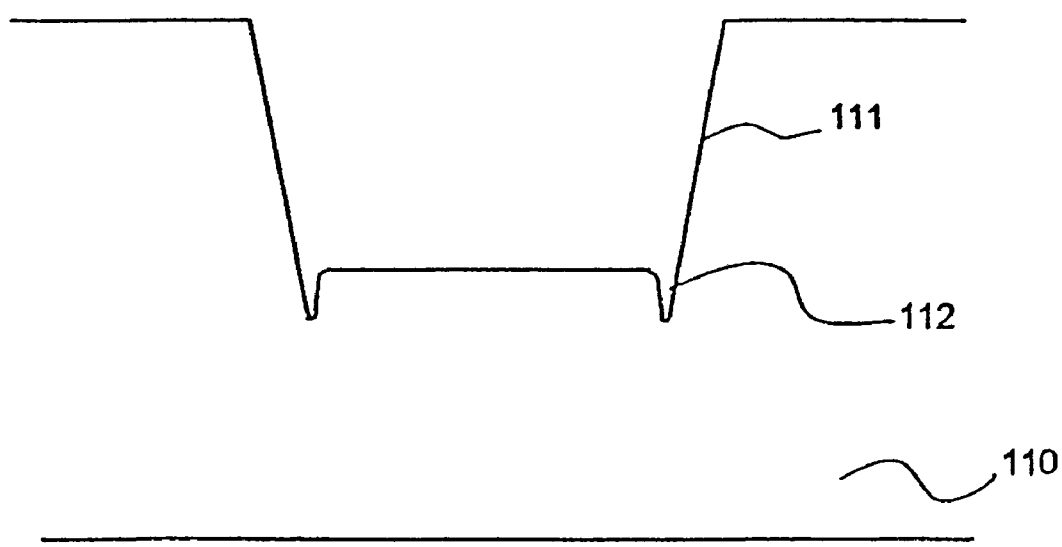
FIG. 8 is a cross-sectional view of a trench shape showing generation of microtrench by dry etching to a conventional SiC laminated semiconductor substrate.

A second embodiment in which changed the etching condition of the first embodiment is changed will be explained. On the basis of condition 9 of Table 1 and the result shown in FIG. 4, according to the second embodiment the trench is etched to around 9/10 (about 9 μm) of the target depth under the etching condition of a first dry etching comprising: the mixed gas of sulfur hexafluoride (SF$_6$), oxygen (O$_2$) and argon (Ar); introducing the sulfur hexafluoride (SF$_6$) flow rate of 4.2 sccm, the oxygen (O$_2$) flow rate of 7 sccm and the argon (Ar) flow rate of 28 sccm; pressure of 0.4 Pa; ICP electric power of 500 W; bias electric power of 15 W applied to the SiC laminated semiconductor substrate side; and the temperature of the SiC laminated semiconductor substrate of 80° C. heated with a heater. FIG. 6B shows a cross-sectional view of SiC laminated semiconductor substrate 10 in which the actual etching shape is observed when the etching depth is 9 μm under the first etching condition. The etching rate under the first etching condition is around 0.6 μm/minute. The high etching speed can be achieved in comparison with the conventional speed of 0.05 μm/minute, but the cross-sectional shape of trench 5 becomes the shape that the bottom is slightly square-built. After etching around 9/10 (9 μm in the second embodiment) of the target depth under the first etching condition, etching under a second etching condition is performed in vacuum (the reduced pressure state) which continues to be held without taking out the sample (SiC laminated semiconductor substrate 10) from the etching apparatus. The reduced pressure state is maintained with the second embodiment, but it is ensured separately that there is not a problem in the case of being left open in the atmospheric air. In addition to being etched 9 μm under the first etching condition, trench 5 is etched further in depth of 1 μm under the second etching condition comprising: using the mixed gas of sulfur hexafluoride (SF$_6$), oxygen (O$_2$) and argon (Ar); introducing the sulfur hexafluoride (SF$_6$) flow rate of 4.2 sccm, the oxygen (O$_2$) flow rate of 8.4 sccm and the argon (Ar) flow rate of 28 sccm; pressure of 0.4 Pa; ICP electric power of 500 W; bias electric power of 15 W applied to the SiC laminated semiconductor substrate side; and the temperature of the SiC laminated semiconductor substrate of 80° C. heated with a heater (the depth of the trench etched under the first etching condition and the second etching condition is 10 μm in total). FIG. 6C shows a cross-sectional view of the SiC laminated semiconductor substrate showing trench 5 in the case of etching under the second etching condition successively after etching under the first etching condition. The etching rate under the second etching condition is lowered to around 0.3 μm/minute, but it is found that the bottom of the trench becomes a shape of U character by adding the etch under the second etching condition. The etching depth is actually 10 μm in total.

It is found that breakdown voltage reduction due to electric field concentration in the bottom of the trench is extremely small in the trench MOS semiconductor device formed by the trench etch process.

As the above result, according to the second embodiment, it is found that not only can a deep trench of more than 3 μm and further more than 10 μm in the SiC laminated semiconductor substrate be achieved by the process of high utility but also etching of the shape of U character in the bottom of the trench can be achieved without forming the convexo-concave shape having the acute angle which has the influence on the breakdown voltage characteristic due to electric field concentration being caused in the bottom of the trench.

Third Embodiment

A third embodiment to according to the method for manufacturing the SiC semiconductor device of the present invention will be explained. After thoroughly cleaning the SiC laminated semiconductor substrate, the $SiO_2$ is layered on the SiC laminated semiconductor substrate in a thickness of 2 μm by CVD. The photoresist is applied on the $SiO_2$ by the spin coat method. The photoresist pattern such as FIG. 1 is formed on the $SiO_2$ as well as the first embodiment. The film thickness of the photoresist is around 2 μm. After forming the photoresist pattern, the $SiO_2$ mask is formed by dry etching of the $SiO_2$ using the photoresist pattern as a mask with the ICP dry etching apparatus. Etching is performed under the condition of etching that fluoroform ($CHF_3$) gas is introduced at 15 sccm at ICP electric power 135 W, at bias electric power 15 W to the SiC laminated semiconductor substrate side and at a pressure of 1 Pa. A patterned line width is 2 μm in the third embodiment. FIG. 2 is a cross-sectional configuration of the mask pattern formed on the SiC laminated semiconductor substrate. As described above, the $SiO_2$ is patterned. After patterning the $SiO_2$ by dry etching, the remaining photoresist is removed by dipping into resist-removing liquid of 70° C., so that SiC laminated semiconductor substrate 10 on which the $SiO_2$ is patterned is formed as shown in FIG. 3.

ICP dry etching of the SiC laminated semiconductor substrate is performed using the $SiO_2$ pattern as a mask for forming the trench. The ICP dry etching of the SiC laminated semiconductor substrate is performed in two steps by changing the etch conditions. The trench is etched to around ⅔ of the target depth under the etching condition of a first dry etching comprising: mixed gas of sulfur hexafluoride ($SF_6$) gas and oxygen ($O_2$) gas; introducing the sulfur hexafluoride ($SF_6$) flow rate of 10 sccm and the oxygen ($O_2$) flow rate of 3 sccm; pressure of 2 Pa; ICP electric power of 500 W; and bias electric power of 15 W applied to the SiC laminated semiconductor substrate side. FIG. 9 is a cross-sectional view of the bottom of the trench in which the actual etching shape is observed when the etching target depth is 5 μm. Etching under the condition of the first dry etching can be performed at an etch rate of 200 nm/minute, but the shape of the trench becomes narrow in the bottom of the trench as shown in FIG. 9 and microtrench 13 is generated at the bottom. After etching around ⅔ of the target depth of 5 μm under the condition of the first dry etching, etching under the condition of the second dry etching is performed successively without taking the SiC laminated semiconductor substrate out of the dry etching apparatus. The condition of the second dry etching comprises mixed gas of sulfur hexafluoride ($SF_6$) gas and oxygen ($O_2$) gas, introducing the sulfur hexafluoride ($SF_6$) flow rate of 12 sccm and the oxygen ($O_2$) flow rate of 10 sccm, pressure of 3 Pa, ICP electric power of 350 W and bias electric power of 5 W applied to the SiC laminated semiconductor substrate side. FIG. 10 shows a cross-sectional view of the bottom of the trench which the actual etching shape is observed in the case of etching to the target depth of 5 μm. In the case of etching under the second etching condition successively after etching under the first etching condition, the etching rate is lowered to around 50 nm/minute, but it is found that there are few narrow portions of the bottom and microtrench.

While not wishing to be bound by a proposed mechanism, it is hypothesized that because the quantity of arrival of gases at the bottom of the trench is increased by increasing the mixed gas flow rate, and the scattering of gases is increased by increasing pressure, and etching gases (fluorine radical and oxygen radical) are supplied to side walls and the bottom of the trench. The etching rate is reduced due to ICP power and bias electric power being reduced and thus generation of the microtrench can be suppressed by etching slowly.

According to the third embodiment, not only can deep trench etching of more than 3 μm be achieved by the process of high utility, but also flat etching can be achieved in the bottom of the trench without forming the convexo-concave shape having the acute angle which has the influence on the breakdown voltage characteristic due to electric field concentration being caused in the bottom of the trench.

Thus, a method of forming a silicon carbide semiconductor device has been described according to the present invention. Many modifications and variations may be made to the techniques and structures described and illustrated herein without departing from the spirit and scope of the invention. Accordingly, it should be understood that the methods described herein are illustrative only and are not limiting upon the scope of the invention.

REFERENCE NUMERALS

1 silicon carbide (SiC) substrate
2 n-type high resistance layer
3 p well layer
4 $SiO_2$ pattern
5 trench
6 gate oxide film
7 gate electrode
8 $n^+$ emitter region
9 interlayer insulation film
10 SiC laminated semiconductor substrate
11 emitter electrode
13 microtrench
14 photoresist

What is claimed is:

1. A method for manufacturing a silicon carbide (SiC) semiconductor device comprising:
    providing a SiC substrate;
    forming a well layer of a conductivity type different from the SiC substrate on the SiC substrate;
    forming selectively an emitter region of the same conductivity type as the SiC substrate in a surface layer of the well layer;
    forming a selective etch mask in a surface of a SiC laminated semiconductor substrate comprising the SiC substrate, the well layer and the emitter region by using a silicon dioxide film ($SiO_2$); and
    forming a trench for a trench gate structure by dry etching with the use of high-density inductively-coupled plasma (ICP) from a surface of the emitter region that is exposed to the surface of the SiC laminated semiconductor substrate;

wherein the dry etching with the use of the high-density ICP comprises a first dry etching and a second dry etching, wherein the etch conditions for the first and second dry etching are different.

2. The method for manufacturing the SiC semiconductor device according to claim 1, wherein the high-density ICP is an ICP which is obtained by ionizing a mixed gas containing fluoride, oxygen and inert gas as a major ingredient.

3. The method for manufacturing the SiC semiconductor device according to claim 2, wherein the dry etching is performed at a pressure of less than or equal to 0.5 Pa.

4. The method for manufacturing the SiC semiconductor device according to claim 2, wherein the etch conditions for the first dry etching comprise:
   (a) using a mixed gas containing sulfur hexafluoride ($SF_6$), oxygen ($O_2$) and argon (Ar) as the major ingredient, and
   (b) etching the trench while heating the SiC laminated semiconductor substrate at 70° C. to 100° C.,
   wherein an argon (Ar) flow rate is 50% to 80% of a total mixed gas flow rate, and a $SF_6/O_2$ flow ratio is 1/2 to 7/10.

5. The method for manufacturing the SiC semiconductor device according to claim 4, wherein the etch conditions for the second dry etching are the same as the etch conditions for the first dry etching except that the $SF_6/O_2$ flow ratio is 1/1, and ICP electric power is not more than 1/2 of that used in the first dry etching and bias electric power to apply to the SiC laminated semiconductor substrate side is increased.

6. The method for manufacturing the SiC semiconductor device according to claim 5, wherein a thickness of the $SiO_2$ used as a mask is 0.5 µm to 3 µm, and after the first dry etching, the second dry etching is performed while maintaining a reduced pressure state in a dry etching apparatus without removing the substrate from the dry etching apparatus.

7. The method for manufacturing the SiC semiconductor device according to claim 1, wherein the etch conditions for the first dry etching comprise:
   (a) using a mixed gas containing sulfur hexafluoride ($SF_6$), oxygen ($O_2$) and argon (Ar) as the major ingredient, and
   (b) etching the trench while heating the SiC laminated semiconductor substrate at 70° C. to 100° C.,
   wherein an argon (Ar) flow rate is 50% to 80% of a total mixed gas flow rate, and a $SF_6/O_2$ flow ratio is 1/2 to 7/10.

8. The method for manufacturing the SiC semiconductor device according to claim 7, wherein the etch conditions for the second dry etching are the same as the etch conditions for the first dry etching except that the $SF_6/O_2$ flow ratio is 1/1, and ICP electric power is not more than 1/2 of that used in the first dry etching and bias electric power to apply to the SiC laminated semiconductor substrate side is increased.

9. The method for manufacturing the SiC semiconductor device according to claim 8, wherein a thickness of the $SiO_2$ used as a mask is 0.5 µm to 3 µm, and after the first dry etching, the second dry etching is performed while maintaining a reduced pressure state in a dry etching apparatus without removing the substrate from the dry etching apparatus.

10. The method for manufacturing the SiC semiconductor device according to claim 8, wherein a thickness of the $SiO_2$ used as a mask is 0.5 µm to 3 µm, and after the first dry etching the dry etching apparatus is opened to atmospheric pressure once, and then the second dry etching is performed after again reducing the pressure in the dry etching apparatus.

* * * * *